United States Patent
Hofmann et al.

(10) Patent No.: US 6,730,930 B2
(45) Date of Patent: May 4, 2004

(54) MEMORY ELEMENT AND METHOD FOR FABRICATING A MEMORY ELEMENT

(75) Inventors: Franz Hofmann, München (DE); Richard Johannes Luyken, München (DE); Wolfgang Rösner, Ottobrunn (DE)

(73) Assignee: Infineon Technologies, AG (DE)

( * ) Notice: Subject to any disclaimer, the term of this patent is extended or adjusted under 35 U.S.C. 154(b) by 41 days.

(21) Appl. No.: 10/275,598

(22) PCT Filed: Aug. 9, 2001

(86) PCT No.: PCT/DE01/03037

§ 371 (c)(1),
(2), (4) Date: Apr. 21, 2003

(87) PCT Pub. No.: WO02/13284

PCT Pub. Date: Feb. 14, 2002

(65) Prior Publication Data

US 2003/0168675 A1 Sep. 11, 2003

(51) Int. Cl.[7] .................................................. H01L 35/24
(52) U.S. Cl. ............................ 257/40; 438/99; 365/151
(58) Field of Search ............................ 257/40; 438/99; 365/151

(56) References Cited

U.S. PATENT DOCUMENTS

| | | | |
|---|---|---|---|
| 3,977,009 A | * | 8/1976 | Ohtsuka et al. ............ 346/74 R |
| 4,371,883 A | | 2/1983 | Potember |
| 4,876,668 A | | 10/1989 | Thakoor |
| 5,831,276 A | | 11/1998 | Gonzalez |
| 6,055,180 A | * | 4/2000 | Gudesen et al. ............ 365/175 |
| 6,072,716 A | | 6/2000 | Jacobson |

FOREIGN PATENT DOCUMENTS

| | | |
|---|---|---|
| DE | 2 314 193 | 12/1973 |
| JP | 4145664 | 5/1992 |
| JP | 6224961 | 8/1994 |
| JP | 8116109 | 5/1995 |
| WO | WO 97/30445 | 8/1997 |
| WO | WO 99/14760 A1 | 3/1999 |

OTHER PUBLICATIONS

R.F. Service, Organic Molecule Rewires Chip Design, Science, vol. 285, pp. 313–315, Jul. 16, 1999.
H.J. Gao et al., Reversible, Nanometer–Scale Conductance Transitions in an Organic Complex, Physical Review Letters, vol. 84, No. 8, pp. 1780–1783, Feb. 2000.
C.P. Collier et al., Electronically Configurable Molecular–Based Logic Gates, Science 285, pp. 391–394, 1999.

* cited by examiner

Primary Examiner—Douglas A. Wille
(74) Attorney, Agent, or Firm—Jeffrey R. Stone; Briggs and Morgan, P.A.

(57) ABSTRACT

A memory element with organic material comprises two metallized layers, arranged one on top of the other, with first lines and second lines which are arranged to intersect with each other. A channel is formed at the intersections between the first line and the second line, which overlaps the first line partially and completely overlaps the second line. The channels are filled with a filling material, the electrical conductivity of which may be altered by an applied electrical voltage.

16 Claims, 2 Drawing Sheets

MEMORY ELEMENT AND METHOD FOR FABRICATING A MEMORY ELEMENT

Figure 1A:
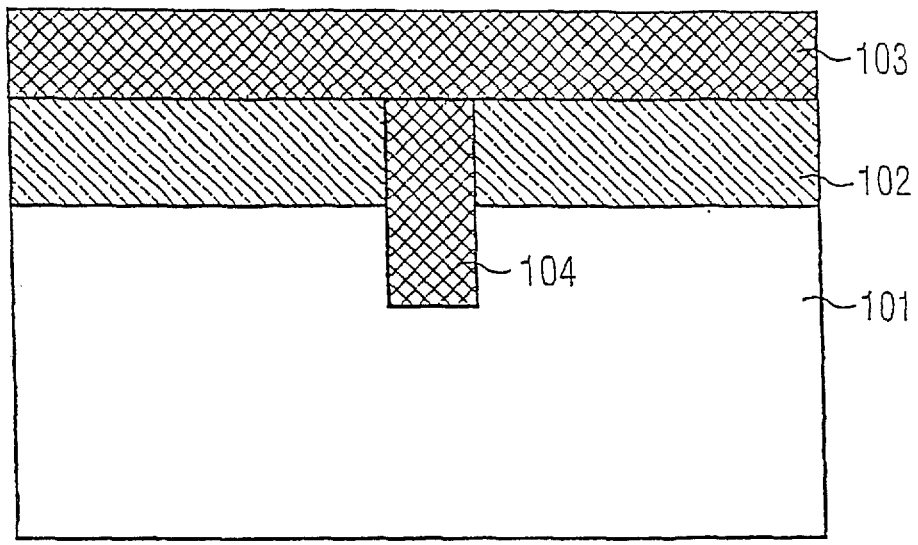

The invention relates to a memory element and to a method for fabricating a memory element.

A memory element of this type and a method for fabricating a memory element of this type are known from [1].

In the memory element which is known from [1], organic complexes are provided for the purpose of electrically coupling first lines in a first metallization layer to second lines in a second metallization layer. However, the organic complexes are introduced into the memory element during the individual fabrication processes for the further components of the memory element, in particular prior to the fabrication of at least some of the wiring planes and metallization layers and of the corresponding contacts.

Examples of organic complexes of this type whose electrical conductivity can change by up to a factor of $10^4$ on account of an electric voltage which is applied to the organic complexes, i.e. to the organic material, are known, for example from [2], as N-(3-nitrobenzylidene)-p-phenylenediamine (NBPDA) or as a system of the two materials 3-nitrobenzal-malononitrile (NBMN) and 1,4-phenylenediamine (pDA).

A further organic material which changes its electrical conductivity as a result of an electric voltage applied to the material is known from [3] as rotaxane.

These organic materials are highly sensitive and can easily be damaged, in particular with regard to their behaviour in terms of changing their electrical conductivity.

One drawback of the memory element which is known from [1] is therefore to be seen in particular as residing in the fact that the organic material which is introduced during the method steps, which in some cases are carried out under a great heat, as part of the fabrication method of the memory element, for example during a silicon process, is very easily damaged by the heat.

Therefore, an organic memory element of this type is highly susceptible to faults and its electrical properties are not very robust.

Furthermore, [4] has disclosed a memory cell arrangement and its use as a magnetic RAM memory element and as an associative memory.

Furthermore, [4] has disclosed a drive circuit for the individual memory cells of the magnetic RAM memory element, for writing and reading binary information into and from the respective memory cells via word lines and bit lines.

[5] describes a memory arrangement having a film of organic material.

[6] describes a ROM having a substrate, to which substrate electrodes are applied. A layer is arranged between the electrodes. The ROM consists of conjugated polymers or oligomers and doping atoms.

Further electrically addressable storage media are described in [7], [8], [9], [10], [11], [12] and [13].

Therefore, the invention is based on the problem of describing a memory element with organic materials and a method for fabricating a memory element of this type, which memory element has a reduced susceptibility to faults compared with the memory element which is known from [1].

A memory element has a substrate in which individual transistors and electrical components of the memory element are usually already present. A first metallization layer, preferably of gold, is applied to the substrate, for example a silicon substrate, and a first insulation layer is applied to the first metallization layer. A second metallization layer, which preferably likewise consists of gold, is applied to the first insulation layer, which is preferably made from plasma dioxide or plasma nitride.

The first metallization layer and the second metallization layer are arranged above one another in parallel planes, so that the individual metallization layers do not touch one another. The first metallization layer is patterned in such a manner that first electric lines, which are in each case electrically insulated from one another by, for example, the first insulation layer, are formed therein.

Furthermore, second electric lines, which are arranged above the first electric lines of the first metallization layer in such a manner that they cross one another but, on account of the first insulation layer arranged between them, are not in electrical contact with one another, are formed in the second metallization layer.

At at least some of the crossing points between the first line and a second line, there is in each case one trench, which at least partially overlaps the first line and directly couples, preferably completely overlaps, the second line.

The term crossing point is to be understood as meaning, for example, a point at which, as a result of a substantially perpendicular being raised on one of the two lines, in each case the other line is also touched.

Each trench, or at least some of the trenches, is/are filled with an organic filler material, the electrical conductivity of which can be changed by an applied electric voltage. The change should be sufficiently strong and enduring for it to be easily and robustly possible to record two different states of the organic material, according to whether there is a voltage applied or no voltage applied, in order reliable writing and reading of binary information to and from the respective memory cell is ensured.

In this context, all organic materials whose electrical conductivity may change in particular by up to a factor of $10^4$, preferably by up to a factor of $10^3$ or $10^2$, are suitable.

The filler material may therefore include, for example, organic complexes, preferably the materials rotaxane, and/or N-(3-nitrobenzylidene)-p-phenylenediamine (NDPDA), and/or a system of the materials 3-nitrobenzal-malononitrile (NBMN) and 1,4-phenylenediamine (pDA)

which are known from [2] and [3].

Beneath the two metallization layers, i.e., for example, between the metallization layers and the substrate or even beneath the substrate, there may be a peripheral electronic circuit, which enables the memory element, in particular the individual memory cells which are formed by in each case a filler material with which a trench has been filled, to respond unambiguously and in a highly robust and fault-insensitive way, for example by a binary value being written to or read from a memory cell.

In this memory element, the binary information is given by the corresponding conductivity of the filler material which is arranged in the trenches between the two lines, which represent the word lines and bit lines of the memory element.

The result is a memory element with organic complexes which is unsusceptible to faults and has a very high integration density, since a memory cell has a minimum space requirement of 4*F*F (F=feature size), i.e. in each case the minimum patterning size of the fabrication process used.

If gold is used for the individual lines, one advantage of the memory element is, inter alia, that, by means, for example, of the known gold-sulphur coupling, the corresponding organic materials bond very well to the electric lines, in particular by means of a covalent bond.

A further advantage when using gold for the individual lines is that the surfaces of the individual lines are not oxidized or are only oxidized to a very minor extent.

The memory element has the advantage in particular that the organic complexes only have to be incorporated after the silicon processing, with the result that damage to the organic material under a high temperature load which is required for individual silicon element fabrication steps does not occur.

Since the entire peripheral circuit may be arranged beneath the respective cell field, the chip surface area which remains active, i.e. is completely available for the memory element, is increased further.

The memory element may have additional wiring layers, in order for the individual electronic components provided in the silicon substrate to be electronically coupled to one another.

Furthermore, a second insulation layer may be provided between the substrate and the first metallization layer, in order for the substrate and the first metallization layer, i.e. in particular the first electric lines, to be electrically insulated from one another.

In a method for fabricating a memory element, a first metallization layer is applied to a substrate and is patterned in such a manner that first lines are formed, which are brought into electrical contact with the substrate. This can be achieved, for example, by forming contact holes between the first lines and the substrate, through a second insulation layer provided between them, so that electrical contact can be made between the first lines and the substrate. A first insulation layer is applied to the first metallization layer, and a second metallization layer is applied to the first insulation layer and is patterned in such a manner that second lines are formed, which although they do not electrically couple the first lines do cross them above the first lines. At least at some of the crossing points between the first lines and the second lines, a trench is formed, which in each case partially overlaps the first line and couples the second line, i.e. preferably completely overlaps the second line. The trenches are filled with a filler material, for example an organic filler material as described above, so that the first lines and the second lines can in each case be electrically coupled to one another via the filler material. As explained above, the filler material has a conductivity which changes considerably as a result of an applied electric voltage.

An exemplary embodiment of the invention is illustrated in the figures and is explained in more detail below. In the figures:

FIGS. 1a to 1d in each case show a cross section through a memory element at different times during its fabrication.

FIG. 1a shows a substrate 101, in which the individual electronic components which are necessary for a memory element in order to activate the latter, in particular the MOS field-effect transistors (not shown) which are required, are already present.

A chemical vapour deposition (CVD) method or alternatively a sputtering method or a physical vapour deposition method is used to apply a first insulation layer 102, preferably of silicon nitride, to the substrate 101, which according to the present exemplary embodiment is made from silicon.

The first insulation layer 102 has a thickness of approximately 300 nm to 700 nm; in this context, it should be noted that the thickness of the first insulation layer 102 is essentially of little importance for the way in which the invention functions and can be selected as desired.

Contact holes 104 are etched after a first photolithography method. Then, trenches with a depth of approximately 100 nm to 200 nm are etched into the insulation layer 102.

Furthermore, if a deposition method from a liquid is used in a subsequent step, an electrically conductive layer is deposited on the first insulation layer 102.

In a further step, a first metallization layer 103 of gold is applied to the first insulation layer 102 or the electrically conductive layer, preferably by means of a deposition method from a liquid (electroplating), or alternatively by means of a sputtering method or a vapour deposition method.

During the deposition of the gold, or in general terms of the metal for forming the first metallization layer 103, the contact holes 104 and the trenches are filled with gold.

A chemical mechanical polishing method (CMP method) is used to form the first metallization layer 103, in that sufficient gold is removed for the gold to be present only in the trenches. In this way, the conductor tracks in the first metallization layer 103 are electrically separated from one another.

Figure 1B:
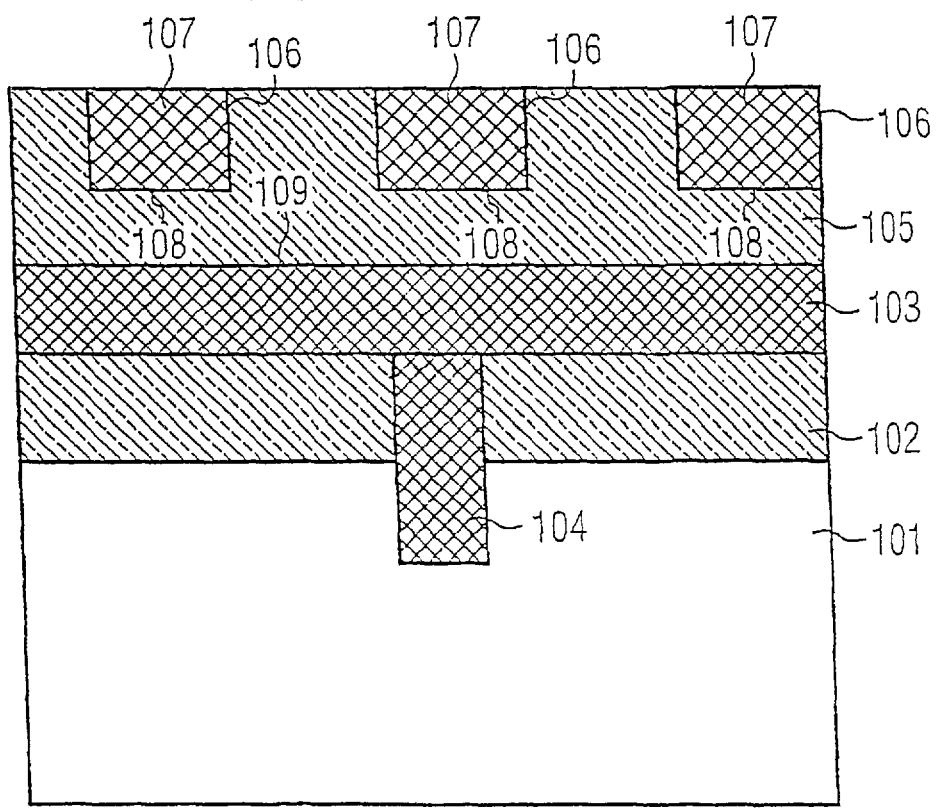
Figure 1C:
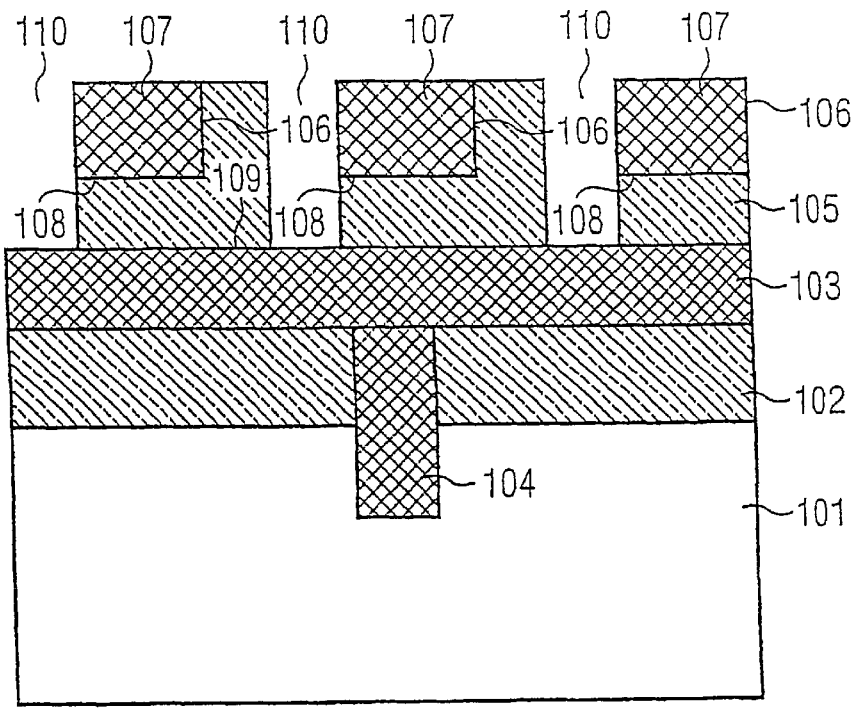

As shown in FIG. 1b, a second insulation layer 105, which according to this exemplary embodiment comprises nitride, is then applied to the first metallization layer 103, by means of a CVD method, a physical vapour deposition method or a sputtering method.

After a further photolithography method, contact holes are in turn etched into the second insulation layer 105.

In a further step, the second insulation layer 105 is patterned by means of photolithography, in such a manner that trenches 106 are etched into it, in which trenches, in a subsequent method step, after removal of the photoresist used for the photolithography, a second metallization layer 107 is formed, which according to the present exemplary embodiment is once again formed from gold.

During the deposition of the gold, both the contact holes and the trenches 106 are filled with gold.

A subsequent CMP method is used to remove the protruding gold, so that gold is then only present in the trenches 106. As a result, the conductor tracks which are formed in the second metallization layer 107 are electrically separated from one another. The second metallization layer 107 which is formed has a thickness of approximately 200 nm.

The second metallization layer 107 is formed by means of an electroplating method, a sputtering method or a physical vapour deposition method, and the trenches 106 are at least partially formed in accordance with the second patterning as second metallization layer 107.

When using an electroplating method to form the second metallization layer 107, a further electrically conductive layer is deposited on the second insulation layer 105 prior to the electroplating.

The trenches 106 are formed in the second insulation layer 105 in such a manner that the thickness of the second insulation layer 105 between the base 108 of a respective trench 106 and the upper surface 109 of the first metallization layer 103 is approximately 100 nm.

In a further step, photolithography is used to generate a mask, into which, in a further step, a multiplicity of holes 110 is introduced by means of dry etching. The holes 110 are formed only at first lines and second lines which cross one another.

The etched holes 110 or trenches 110 are arranged in such a manner in the memory element 100 which is formed (cf. FIG. 1c) that they make full electrical contact with the first lines of the first metallization layer 103 and penetrate partially through the second lines of the second metallization layer 107, for example as a result of an edge region or, in general, a partial region of a second line being removed by etching of the respective trench 110.

The trenches 106 preferably have a diameter of approximately 50 nm to 100 nm; in the case of rectangular trenches, the respective sides of a trench 110 are in each case approximately 50 nm to 100 nm.

In this context, it should be noted that only a part of the second line is removed by in each case one trench 110, so that a second line which is sufficient to provide appropriate electrical conductivity remains in place, which second line can be brought into electrical contact with the respective first electrical line of the first metallization layer 103 by means of an organic material which has been introduced in a step which is explained below.

Then, the photoresist is removed, after the trenches 110 have been etched through both the second metallization layer 107 and through the second insulation layer 105.

In a final step, N-(3-nitrobenzylidene)-p-phenylenediamine is deposited in the trenches 110 as filler material 111, using the method described in [2].

Figure 1D:
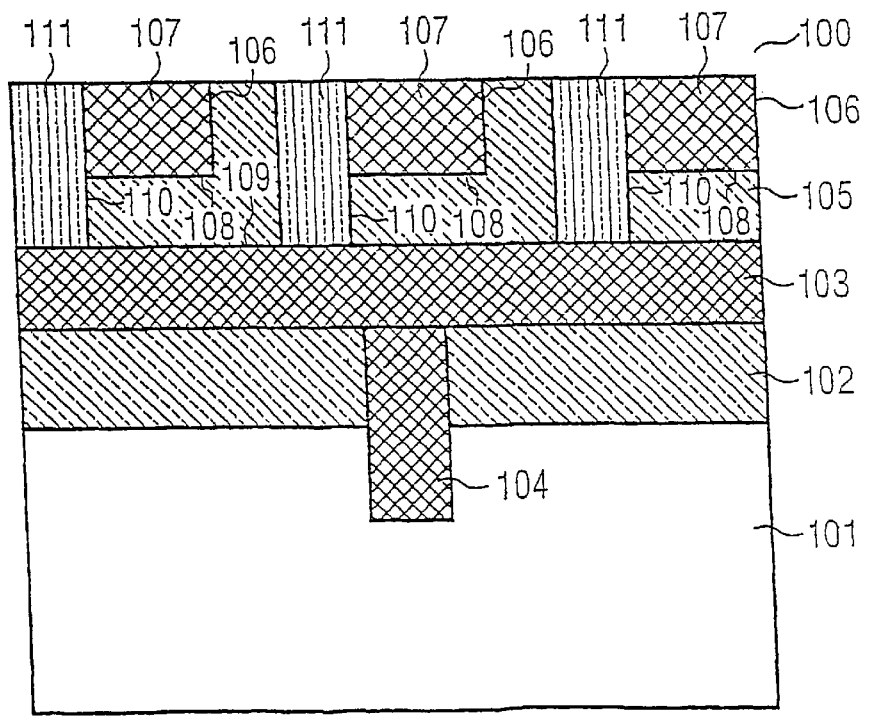

Alternatively, the method described in [3] can be used to deposit rotaxane as filler material 111 in the memory element 110 illustrated in FIG. 1d.

In a final step, the filler material 111 which projects above the trenches 110 is etched back, i.e. removed.

According to the exemplary embodiment, the first lines form the word lines and the second lines form the bit lines of the memory element 100.

The activation circuit of the individual memory cells of the memory element 100, which are formed by the word lines and bit lines of the first metallization layer 103 and second metallization layer 107, respectively, and the trenches 110 filled with the filler material 111, according to the present exemplary embodiment, is designed in the same way as that described in [4].

The following publications are cited in this document:

[1] R. F. Service, Organic Molecule Rewires Chip Design, Science, Vol. 285, pp. 313–315, 16 Jul. 1999
[2] H. J. Gao et al., Reversible, Nanometer-Scale Conductance Transitions in an Organic Complex, Physical Review Letters, Vol. 84, No. 8, pp. 1780–1783, February 2000
[3] C. P. Collier et al., Electronically Configurable Molecular-Based Logic Gates, Science 285, pp. 391–394, 1999
[4] WO 99/14760 A1
[5] DE OS 2 314 193
[6] WO 97/30445
[7] U.S. Pat. No. 6,055,180
[8] U.S. Pat. No. 6,072,716
[9] U.S. Pat. No. 4,876,668
[10] U.S. Pat. No. 4,371,883
[11] JP 08-116 109 A
[12] JP 06-222 4961 A
[13] JP 04-414 5664 A

LIST OF REFERENCE SYMBOLS

100 Memory element
101 Substrate
102 First insulation layer
103 First metallization layer
104 Contact hole
105 Second insulation layer
106 Trench
107 Second metallization layer
108 Bottom of trench
109 Surface of first metallization layer
110 Trench
111 Filler material

What is claimed is:

1. Memory element
having a substrate,
having a first metallization layer,
having a second metallization layer,
in which the first metallization layer and the second metallization layer are arranged above one another in parallel planes, a first insulation layer being arranged between the first metallization layer and the second metallization layer,
first lines in the first metallization layer and second lines in the second metallization layer being arranged so that they cross one another,
in which a trench, which partially overlaps the first line and couples the second line, is formed at at least some of the crossing points between the first line and the second line, and
in which the trench is filled with a filler material, the electrical conductivity of which can be changed by an applied electric voltage.

2. Memory element according to claim 1, in which the filler material includes organic complexes.

3. Memory element according to claim 2, in which the filler material includes at least one of the following materials:
rotaxane,
N-(3-nitrobenzylidene)-p-phenylenediamine (NBPDA), and/or
a system comprising the materials 3-nitrobenzalmalononitrile (NBMN) and 1,4-phenylenediamine (pDA).

4. Memory element according to one of claims 1 to 3, in which the substrate contains silicon.

5. Memory element according to one of claims 1 to 4, in which the first metallization layer and/or the second metallization layer contains gold.

6. Memory element according to one of claims 1 to 5, in which a peripheral electronic circuit is arranged beneath the trench.

7. Memory element according to one of claims 1 to 6,
having at least one first wiring layer, and
having at least one second wiring layer.

8. Memory element according to one of claims 1 to 7, in which a second insulation layer is provided between the substrate and the first metallization layer.

9. Memory element according to one of claims 1 to 8, in which the first insulation layer and/or a second insulation layer which is provided between the substrate and the first metallization layer contains silicon nitride or silicon dioxide.

10. Method for fabricating a memory element,
in which a first metallization layer is applied to a substrate and is patterned in such a manner that first lines are formed, which are brought into electrical contact with the substrate,
in which a first insulation layer is applied to the first metallization layer,
in which a second metallization layer is applied to the first insulation layer and is patterned in such a manner that second lines are formed, which cross the first lines,
in which a trench, which partially overlaps the first line and couples the second line, is formed at at least some of the crossing points between a first line and a second line, in which the trench is filled with a filler material, the electrical conductivity of which can be changed by an applied electric voltage.

11. Method according to claim 10, in which organic complexes are used as filler material.

12. Method according to claim 11, in which, the filler material used is at least one of the following materials:

rotaxane,

N-(3-nitrobenzylidene)-p-phenylenediamine (NBPDA), and/or a system comprising the materials 3-nitrobenzalmalononitrile (NBMN) and 1,4-phenylenediamine (pDA).

13. Method according to one of claims 10 to 12, in which the substrate used is silicon.

14. Method according to one of claims 10 to 13, in which gold is used for the first metallization layer and/or the second metallization layer.

15. Method according to one of claims 10 to 14, in which a second insulation layer is introduced between the substrate and the first metallization layer.

16. Method according to one of claims 10 to 15, in which contact holes are formed through the second insulation layer, between the first lines and the substrate.

* * * * *